United States Patent
Kashiwagi et al.

(10) Patent No.: US 6,969,554 B2
(45) Date of Patent: Nov. 29, 2005

(54) SEMICONDUCTOR SEALING SILICONE COMPOSITION AND SEMICONDUCTOR DEVICE

(75) Inventors: Tsutomu Kashiwagi, Annaka (JP); Masachika Yoshino, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/352,129

(22) Filed: Jan. 28, 2003

(65) Prior Publication Data
US 2003/0181624 A1 Sep. 25, 2003

(30) Foreign Application Priority Data
Jan. 28, 2002 (JP) ......................................... 2002-019167

(51) Int. Cl.⁷ .............................................. B32B 25/20
(52) U.S. Cl. ........................ 428/447; 528/15; 528/20; 528/32; 525/478
(58) Field of Search .............................. 528/15, 20, 32; 525/478; 428/447

(56) References Cited

U.S. PATENT DOCUMENTS

| | | |
|---|---|---|
| 3,159,601 A | 12/1964 | Ashby |
| 3,159,662 A | 12/1964 | Ashby |
| 3,220,972 A | 11/1965 | Lamoreaux |
| 3,445,420 A | 5/1969 | Kookootsedes et al. |
| 3,775,452 A | 11/1973 | Karstedt |
| 5,036,024 A * | 7/1991 | Mine et al. .................... 29/827 |
| 5,529,837 A * | 6/1996 | Fujiki et al. ................. 442/136 |
| 5,629,387 A | 5/1997 | Frances et al. |

FOREIGN PATENT DOCUMENTS

JP 8-269339 10/1996

\* cited by examiner

*Primary Examiner*—Kuo-Liang Peng
(74) *Attorney, Agent, or Firm*—Oblon, Spivak, McClelland, Maier & Neustadt, P.C.

(57) ABSTRACT

A silicon composition as described below, which is suitable for sealing semiconductors, is provided. The silicone composition comprises (A) a diorganopolysiloxane with at least two alkenyl groups bonded to silicon atoms, (B) an organohydrogenpolysiloxane with at least two hydrogen atoms bonded to silicon atoms, (C) an adhesion imparting constituent, (D) a platinum group metal based catalyst, and (E) a compound represented by a general formula (1):

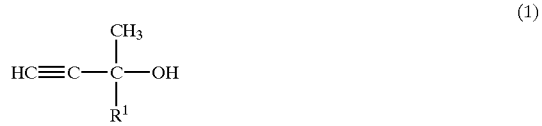

(wherein, $R^1$ represents a monovalent hydrocarbon group of at least 10 carbon atoms, which may contain a hydroxyl group or an ether linkage). The silicon composition displays excellent adhesion to semiconductor chips, and enables the production of a semiconductor device with superior resistance to moisture permeation.

29 Claims, 1 Drawing Sheet

SEMICONDUCTOR SEALING SILICONE COMPOSITION AND SEMICONDUCTOR DEVICE

BACKGROUND OF THE INVENTION

1. Field of the Invention

The present invention relates to a sealant for covering a semiconductor element, and a semiconductor device, and more specifically relates to a silicone sealant for covering the surface of a semiconductor device component such as a substrate member or a lead frame, and to a highly reliable semiconductor device with superior moisture resistance and electrical insulation formed using such a semiconductor element sealant.

2. Description of the Prior Art

In order to protect a semiconductor element electrically, mechanically and chemically, prevent the migration of ion impurities and water from a molded resin such as an epoxy resin or a phenol resin into the element, and also prevent the cutting or passivation cracking of aluminum, gold or copper bonding wire arising from stress concentration produced by the molded resin, the surface of a semiconductor element is usually covered with a low elasticity resin with a low level of ionic impurities. Conventionally, these covering materials for semiconductor elements have utilized curable silicone sealants, which display good adhesion to the semiconductor element and excellent stress relaxation properties, and also offer low water absorption and excellent electrical insulation. Many semiconductor devices using such sealants have been proposed. Furthermore in recent years, methods have been proposed in which elements are sealed and shaped using screen printing techniques, either under conditions of normal pressure or under vacuum, although a sealant which has a sufficiently long pot life to enable satisfactory working, and yet undergoes rapid curing with good maintenance of shape and form is still keenly sought. In particular, addition reaction curing type silicone rubber sealants which utilize hydrosilylation can be cured within a short period of time by heating, and offer good levels of productivity with minimal generation of by-products during curing, and are consequently widely used. However, the curing reaction of addition reaction curing type silicone rubber compositions proceeds even at room temperature, meaning the compositions are prone to scorching and gelling, and the shortness of the pot life places considerable constraints on their workability.

As a result, improved techniques have been proposed for ensuring an adequate pot life. An example is the use of an acetylene compound with a boiling point of at least 25° C. (and preferably no more than 250° C.), as disclosed in Japanese Post-Examination Patent publication (kokoku) No. 44-31476 (JP44-31476B) corresponding to U.S. Pat. No. 3,445,420. However, when added to a silicone rubber composition, an acetylene compound of this application volatilizes readily and can cause partial scorching on the surface of the silicone rubber composition, and furthermore if cured under heating, can cause either corrugations on the surface of the cured product of the electrically insulating sealant, or internal foaming. In addition, because these acetylene compounds are volatile, as described above, they must be stored and handled in a sealed state, making them unsuitable for screen printing applications, which require a considerable length of time.

Furthermore, Japanese Laid-open Patent publication (kokai) No. 6-329917 (JP6-329917A) corresponding to U.S. Pat. No. 5,629,387 discloses the use of a hydroxyl group containing acetylene based compound represented by a formula R(R')C(OH)—C≡CH (wherein, R and R' represent monovalent hydrocarbon groups) in which the total number of carbon atoms contained within R and R' is at least 9, and an organopolysiloxane based adhesion modifier formed from "Q" ($SiO_2$) units and/or "T" ($RSiO_{3/2}$) units, as a hydrosilylation reaction inhibitor and control agent. However, because the organopolysiloxane formed from the Q and/or T units is a varnish structure, the production of a homogeneous product with good stability is difficult, and the costs are also considerable. In addition, Japanese Laid-open Patent publication (kokai) No. 8-269339 (JP8-269339A) discloses the use of a hydroxyl group containing acetylene based compound represented by a formula $R(CH_3)C(OH)$—C≡CH (wherein, R represents a monovalent hydrocarbon group of at least 9 carbon atoms) as a hydrosilylation reaction inhibitor and control agent, although no mention is made of the adhesive properties.

SUMMARY OF THE INVENTION

Accordingly, an object of the present invention is to provide a silicone sealant for covering the surface of a semiconductor device component, which can be stored for extended periods and consequently provides adequate working time, can be cured rapidly by heating and is consequently suitable for screen printing applications, and also offers good productivity and displays excellent adhesion to semiconductor chips and mounting members, as well as to provide a highly reliable semiconductor device with superior moisture resistance and electrical insulation, produced using such a semiconductor element sealant.

In other words, a first aspect of the present invention provides an addition curing type silicone composition for sealing a semiconductor device comprising:

(A) 100 parts by weight of a diorganopolysiloxane with at least two alkenyl groups bonded to silicon atoms within each molecule, (B) an organohydrogenpolysiloxane with at least two hydrogen atoms bonded to silicon atoms (namely, SiH groups) within each molecule, in sufficient quantity to produce 0.5 to 10 mols of hydrogen atoms bonded to silicon atoms within the constituent (B) per 1 mol of alkenyl groups bonded to silicon atoms within the constituent (A), (C) 0.05 to 20 parts by weight of an adhesion imparting constituent, (D) 0.1 to 2,000 ppm of a platinum group metal based catalyst, relative to the total weight of the constituents (A) and (B), and (E) a compound represented by a general formula (1) shown below,

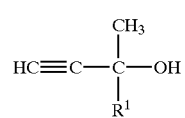

(1)

(wherein, $R^1$ represents a monovalent hydrocarbon group of at least 10 carbon atoms), in sufficient quantity to produce a molar ratio within a range from 1 to 1000 relative to the quantity of the platinum group metal within the constituent (D).

A second aspect of the present invention provides a semiconductor device sealed with a cured product of the above addition curing type silicone composition.

DETAILED DESCRIPTION OF THE PREFERRED EMBODIMENTS

Figure 1:
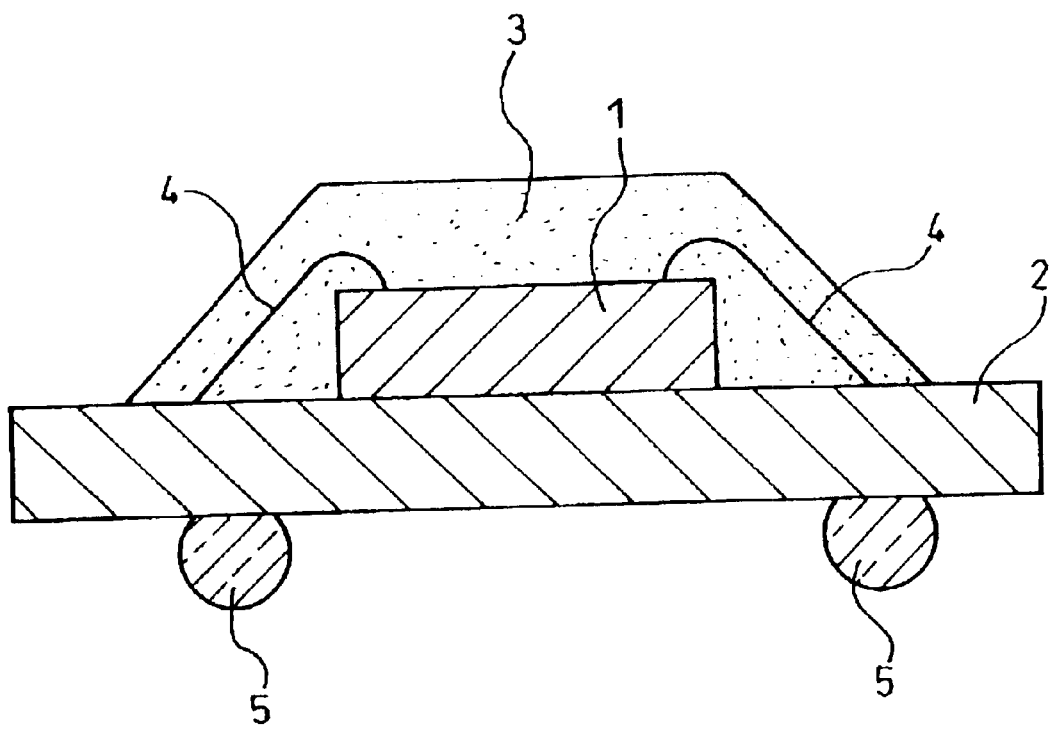
FIG. 1 is a cross-sectional view of an IC, which represents an example of a semiconductor device of the present invention.

As follows is a more detailed description of the present invention.

[Constituent (A)]

Constituent (A) is a diorganopolysiloxane with at least two alkenyl groups bonded to silicon atoms within each molecule, and is used as a base polymer of a composition of the present invention. The principal chain portion of this alkenyl group containing diorganopolysiloxane is formed basically from repeating diorganosiloxane units, and a straight chain in which both terminals of the molecular chain are blocked with triorganosiloxy groups is a typical example, although the constituent (A) is not restricted to this type of structure, and structures with branching in one portion of the molecular structure, and overall cyclic structures are also possible. Of these structures, straight chain diorganopolysiloxanes are preferred in terms of their physical properties, including the mechanical strength (for example, the elongation) of the cured product. The alkenyl groups may be bonded at (both) terminals of the molecular chain and/or on side chains of the molecular chain. Representative example of this type of alkenyl group containing diorganopolysiloxane include the diorganopolysiloxanes represented by a general formula (2) shown below.

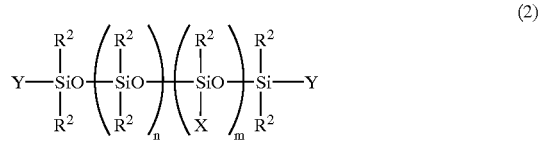

(2)

(wherein, each $R^2$ represents, independently, a substituted or unsubstituted monovalent hydrocarbon group with no aliphatic unsaturated bonds, X represents an alkenyl group, each Y represents, independently, an alkenyl group or a group $R^2$ as defined above, n represents an integer of 0 or greater and m represents an integer of 0 or greater, although the sum of m+n is within a range from 10 to 10,000, and when m=0 both Y groups are alkenyl groups, whereas when m=1 at least one of the Y groups is an alkenyl group)

In the general formula (2) above, examples of the substituted or unsubstituted monovalent hydrocarbon group with no aliphatic unsaturated bonds of the group $R^2$ include alkyl groups such as methyl groups, ethyl groups, propyl groups, isopropyl groups, butyl groups, isobutyl groups, t-butyl groups, pentyl groups, neopentyl groups, hexyl groups, heptyl groups, octyl groups, nonyl groups, decyl groups and dodecyl groups; cycloalkyl groups such as cyclopentyl groups, cyclohexyl groups and cycloheptyl groups; aryl groups such as phenyl groups, tolyl groups, xylyl groups, naphthyl groups and biphenylyl groups; aralkyl groups such as benzyl groups, phenylethyl groups, phenylpropyl groups and methylbenzyl groups; as well as groups in which at least a portion of the hydrogen atoms bonded to carbon atoms within the above groups are substituted with either halogen atoms such as fluorine, chlorine or bromine, or cyano groups, including halogen substituted alkyl groups, cyano substituted alkyl groups and halogen substituted aryl groups such as chloromethyl groups, 2-bromoethyl groups, 3-chloropropyl groups, 3,3,3-trifluoropropyl groups, chlorophenyl groups, fluorophenyl groups, cyanoethyl groups and 3,3,4,4,5,5,6,6,6-nonafluorohexyl groups. $R^2$ groups with 1 to 12 carbon atoms, and preferably 1 to 8 carbon atoms, are desirable. Furthermore of the above groups, substituted or unsubstituted alkyl groups of 1 to 3 carbon atoms such as methyl groups, ethyl groups, propyl groups, chloromethyl groups, bromoethyl groups, 3,3,3-trifluoropropyl groups and cyanoethyl groups; and substituted or unsubstituted phenyl groups such as phenyl groups, chlorophenyl groups and fluorophenyl groups are preferred, and methyl groups, ethyl groups, phenyl groups and 3,3,3-trifluoropropyl groups are particularly desirable.

Furthermore, in a diorganopolysiloxane of the constituent (A), at least 97 mol % of all the organic substituents bonded to silicon atoms within the molecule (namely, the $R^2$ groups and the groups X and Y described below) should preferably be methyl groups.

In the aforementioned general formula (2), specific examples of the alkenyl group of the group X include alkenyl groups of 2 to 8 carbon atoms such as vinyl groups, allyl groups, propenyl groups, isopropenyl groups, butenyl groups, hexenyl groups and cyclohexenyl groups. Of these, lower alkenyl groups of 2 to 4 carbon atoms such as vinyl groups and allyl groups are preferred. Furthermore, the group Y represents either an alkenyl group or an $R^2$ group, as defined above, and the two Y groups may be the same or different, although compounds in which both Y groups are alkenyl groups are preferred.

In the general formula (2), n represents an integer of 0 or greater, and preferably an integer from 10 to 10,000, and even more preferably an integer from 50 to 2,000. m represents an integer of 0 or greater, and preferably an integer from 0 to 100. Furthermore, the sum of n+m is an integer within a range from 10 to 10,000 and the value of m/(m+n) is preferably from 0 to 0.2, and the sum of n+m is preferably an integer from 50 to 10,000, and even more preferably from 50 to 2,000, and the value of m/(m+n) is even more preferably from 0 to 0.05. An alkenyl group containing diorganopolysiloxane of the constituent (A) may utilize either a single compound, or a combination of two or more compounds, and the viscosity at 25° C. of the constituent (A) is within a range from 0.01 to 1,000 Pa·s, and preferably from 0.1 to 500 Pa.s.

[Constituent (B)]

An organohydrogenpolysiloxane of the constituent (B) functions as a cross linking agent, and provided the compound comprises at least two, preferably at least three hydrogen atoms bonded to silicon atoms within each molecule, any structure is acceptable including straight chain structures, branched chain structures, cyclic structures, and three dimensional network structures. The organohydrogenpolysiloxane should preferably contain from 2 to 200 SiH groups, and even more preferably from 3 to 100 SiH groups within each molecule. The organohydrogenpolysiloxane of the constituent (B) should typically have a viscosity at 25° C. within a range from 0.2 to 100,000 mPa·s, and preferably from 1 to 5,000 mPa·s, and should preferably be a liquid at room temperature (25° C.). Examples of suitable organohydrogenpolysiloxanes include those represented by an average composition formula (3) shown below.

(3)

In the above formula (3), $R^3$ represents an unsubstituted or substituted monovalent hydrocarbon group, preferably of 1 to 10 carbon atoms, but excluding groups with aliphatic unsaturated bonds. Examples of this group $R^3$ include the same substituted or unsubstituted monovalent hydrocarbon groups with no aliphatic unsaturated bonds bonded to silicon atoms, which were described above in relation to the $R^2$ groups of the constituent (A), although alkyl groups and aryl groups are preferred, and methyl groups and phenyl groups are particularly preferred. a represents a positive number from 0.7 to 2.1, and b represents a positive number from 0.001 to 1.0, although a+b must be from 0.8 to 3.0, and a values from 1.0 to 2.0, b values from 0.01 to 1.0, and a+b values from 1.5 to 2.5 are particularly preferred.

The constituent (B) can be produced using conventionally known methods. In a typical production method, octamethylcyclotetrasiloxane and/or tetramethylcyclotetrasiloxane, and a compound to form the terminal groups such as hexamethyldisiloxane or a compound incorporating a 1,1'-dihydro-2,2',3,3'-tetramethyldisiloxane unit are subjected to equilibration in the presence of a catalyst such as sulfuric acid, trifluoromethanesulfonic acid or methanesulfonic acid, at a temperature of −10 to +40° C.

Specific examples of the organohydrogenpolysiloxane of the formula (3) include 1,1,3,3-tetramethyldisiloxane, methylhydrogencyclopolysiloxane, cyclic copolymers of methylhydrogensiloxane and dimethylsiloxane, methylhydrogenpolysiloxane with both terminals blocked with trimethylsiloxy groups, copolymers of dimethylsiloxane and methylhydrogensiloxane with both terminals blocked with trimethylsiloxy groups, dimethylpolysiloxane with both terminals blocked with dimethylhydrogensiloxy groups, copolymers of dimethylsiloxane and methylhydrogensiloxane with both terminals blocked with dimethylhydrogensiloxy groups, copolymers of methylhydrogensiloxane and diphenylsiloxane with both terminals blocked with trimethylsiloxy groups, copolymers of methylhydrogensiloxane, diphenylsiloxane and dimethylsiloxane with both terminals blocked with trimethylsiloxy groups, copolymers of methylhydrogensiloxane, dimethylsiloxane and diphenylsiloxane with both terminals blocked with dimethylhydrogensiloxy groups, copolymers formed from $(CH_3)_2HSiO_{1/2}$ units, $(CH_3)_3SiO_{1/2}$ units and $SiO_{4/2}$ units, copolymers formed from $(CH_3)_2HSiO_{1/2}$ units and $SiO_{4/2}$ units, copolymers formed from $(CH_3)_2HSiO_{1/2}$ units, $SiO_{4/2}$ units and $(C_6H_5)_3SiO_{1/2}$ units, 1,3,5,7-tetrahydrogen-1,3,5,7-tetramethylcyclotetrasiloxane, 1-propyl-3,5,7-trihydrogen-1,3,5,7-tetramethylcyclotetrasiloxane, and 1,5-dihydrogen-3,7-dihexyl-1,3,5,7-tetramethylcyclotetrasiloxane.

The quantity of the constituent (B) should be sufficient to generate a molar ratio of 0.5 to 10, and preferably 1 to 7, of the hydrogen atoms bonded to silicon atoms within the constituent (B) (namely, SiH groups) relative to the quantity of alkenyl groups bonded to silicon atoms within the organopolysiloxane of the constituent (A). At molar ratios of less than 0.5, the degree of cross linking may be insufficient, whereas at molar ratios exceeding 10, the product silicone rubber becomes brittle, and unreacted hydrogen atoms bonded to silicon atoms remain in the structure, making the product less stable.

[Constituent (C)]

The constituent (C) functions as an adhesion imparting constituent, and includes compounds such as those described below.

(i) Alkoxysilanes represented by the general formula $R^4_cSi(OR^5)_{4-c}$ (wherein, $R^4$ represents a hydrogen atom, a γ-glycidoxypropyl group and/or an alkenyl group, $R^5$ represents an alkyl group or an alkoxy substituted alkyl group, and c represents either 0 or 1), or partial hydrolysis condensates thereof (namely, siloxane oligomers).

In the above formula, examples of the alkenyl group of the group $R^4$, other than the hydrogen atom and the γ-glycidoxypropyl group, include alkenyl groups of 2 to 8 carbon atoms such as vinyl groups, allyl groups, propenyl groups, isopropenyl groups, butenyl groups, hexenyl groups and cyclohexenyl groups, and of these, lower alkenyl groups of 2 to 4 carbon atoms such as vinyl groups and allyl groups are preferred. Examples of the $R^5$ alkyl group include methyl groups, ethyl groups, propyl groups, butyl groups, pentyl groups, hexyl groups, heptyl groups, octyl groups, nonyl groups, decyl groups and octadecyl groups, although methyl groups are preferred. Furthermore, examples of the alkoxy substituted alkyl groups of the group $R^5$ include methoxyethyl groups, ethoxyethyl groups, methoxypropyl groups and methoxybutyl groups.

Specific examples of alkoxysilanes of the constituent (C) represented by the above formula, or of partial hydrolysis condensates thereof include tetrafunctional alkoxysilanes such as tetramethoxysilane, tetraethoxysilane and methyl cellosolve orthosilicate; trifunctional alkoxysilanes such as trimethoxysilane, triethoxysilane, vinyltrimethoxysilane, vinyltriethoxysilane, allyltrimethoxysilane, allyltriethoxysilane, γ-glycidoxypropyltrimethoxysilane and γ-glycidoxypropyltriethoxysilane; as well as partial hydrolysis condensates of these alkoxysilanes. These compounds may be used singularly, or in mixtures of two or more compounds or partial hydrolysis condensates.

(ii) Organosilanes or Organosiloxane Modified Isocyanurates

These compounds are disclosed in Japanese Post-Examination publication, (kokoku) No. 45-2354 (JP45-2354B), and can be easily synthesized by performing an addition reaction of an isocyanurate containing an alkenyl group such as a vinyl group or an allyl group, with an organosilane or an organosiloxane with a SiH group in the presence of a platinum group metal catalyst. Specific examples of these compounds are shown below.

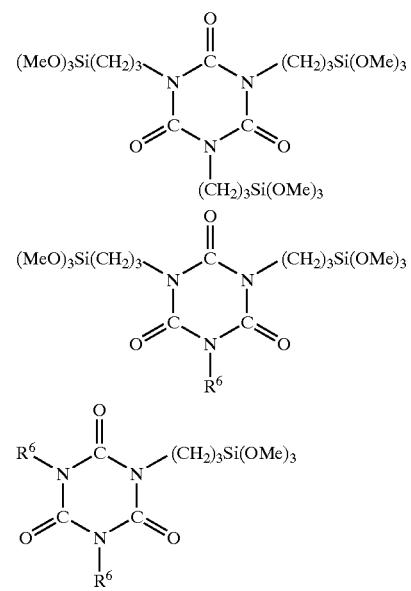

(wherein, Me represents a methyl group, each $R^6$ group represents, independently, a hydrogen atom, an alkyl group, an arylalkyl group, a polycyclic aryl group, a heterocyclic aryl group or a monofunctional lower alkenyl group)

(iii) Epoxy Group Containing Hydrogenpolysiloxanes

Preferred compounds include straight chain or cyclic organohydrogenpolysiloxanes, typically of 4 to 20 silicon atoms, containing at least one, and preferably from 1 to 4, epoxy group substituted monovalent hydrocarbon groups such as γ-glycidoxypropyl groups or β-(3,4-epoxy) cyclohexylethyl groups per molecule, and also containing at least one, and preferably from 2 to 10, hydrogen atoms bonded to silicon atoms (SiH groups) within each molecule. Specific examples of these compounds are shown below.

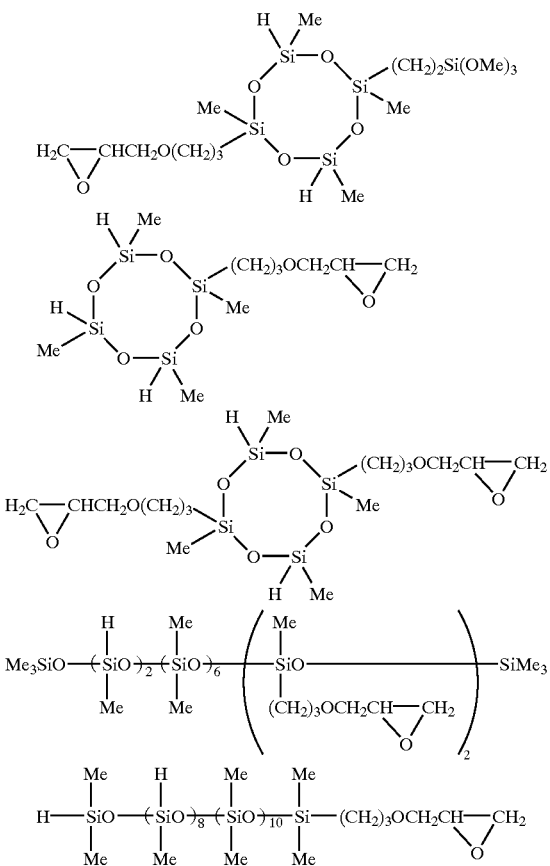

(wherein, Me represents a methyl group)

In addition to the groups of compounds (i) to (iii) described above, other known constituents with effective adhesion imparting properties may also be added.

The quantity of the constituent (C) must be within a range from 0.05 to 20 parts by weight per 100 parts by weight of the constituent (A), and should preferably fall within a range from 0.1 to 10 parts by weight. If the quantity of the constituent (C) is less than 0.05 parts by weight per 100 parts by weight of the constituent (A), then the adhesion of the silicone cured product obtained on curing the composition is unsatisfactory, whereas if the quantity exceeds 20 parts by weight, then the physical properties (such as the mechanical strength) and the heat resistance of the product sealant deteriorate markedly.

[Constituent (D)]

The platinum group metal based catalyst of the constituent (D) is a catalyst for promoting the addition reaction (hydrosilylation reaction) between the alkenyl groups of the constituent (A) and the SiH groups of the constituent (B). This platinum group metal based catalyst may utilize known hydrosilylation reaction catalysts. Specific examples of these catalysts include platinum group simple metals such as platinum (including platinum black), rhodium and palladium; platinum chlorides such as $H_2PtCl_4 \cdot nH_2O$, $H_2PtCl_6 \cdot nH_2O$, $NaHPtCl_6 \cdot nH_2O$, $KHPtCl_6 \cdot nH_2O$, $Na_2PtCl_6 \cdot nH_2O$, $K_2PtCl_4 \cdot nH_2O$, $PtCl_4 \cdot nH_2O$, $PtCl_2$ and $Na_2HPtCl_4 \cdot nH_2O$ (wherein, n represents an integer from 0 to 6, and preferably either 0 or 6); chloroplatinic acid and chloroplatinates; alcohol modified chloroplatinic acid (refer to U.S. Pat. No. 3,220,972); complexes of chloroplatinic acid and olefins (refer to U.S. Pat. Nos. 3,159,601, 3,159,662 and 3,775,452); a platinum group metal such as platinum black or palladium supported on a carrier such as alumina, silica or carbon; rhodium-olefin complexes; chlorotris (triphenylphosphine)rhodium (Wilkinson's catalyst); and complexes of platinum chloride, chloroplatinic acid or a chloroplatinate with a vinyl group containing siloxane and particularly a vinyl group containing cyclic siloxane. The quantity of the constituent (D), calculated as a weight referenced quantity of platinum group metal within the constituent, is within a range from 0.1 to 2,000 ppm, and preferably from 0.1 to 1,000 ppm, and even more preferably 0.5 to 500 ppm, relative to the combined weight of the constituent (A) and the constituent (B).

[Constituent (E)]

The constituent (E) acts as an inhibitor and control agent for the hydrosilylation reaction (the curing reaction), and utilizes a compound represented by a general formula (1) shown below.

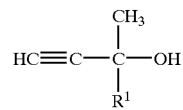
(1)

In the above formula, $R^1$ represents a monovalent hydrocarbon group of at least 10 carbon atoms, and preferably form 10 to 50 carbon atoms, and even more preferably from 10 to 30 carbon atoms, which may contain a carbon-carbon double bond a —C≡C— bond, an —OH group or an ether linkage. If the number of carbon atoms is less then 10, then the constituent displays insufficient control action within the present invention. Specific examples of the group $R^1$ include those groups shown below.

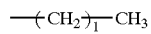

(wherein, l represents an integer of 9 or greater)

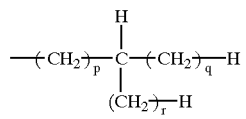

(wherein, p, q and r each represent an integer of 0 or greater, and the sum of p+q+r represents an integer of 9 or greater)

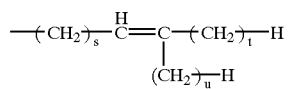

(wherein, s, t and u each represent an integer of 0 or greater, and the sum of s+t+u represents an integer of 8 or greater)

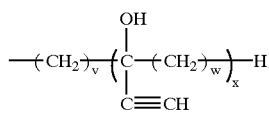

(wherein, v and w each represent an integer of 0 or greater, x represents an integer of 1 or greater, and the total number of carbon atoms within the group is at least 10)

(wherein, y and z each represent an integer of 0 or greater, and the sum of y+z represents an integer of 9 or greater)

It is important that the constituent (E) comprises both a methyl group and the aforementioned $R^1$ group, and by including a constituent (E) comprising both a methyl group and an aforementioned $R^1$ group in a silicone sealant of the present invention, a sealant is obtained which can be stored for extended periods, undergoes rapid curing under heat, and is capable of covering the surface of a semiconductor device component with a good level of productivity, and furthermore the physical properties, such as the moisture resistance and the electrical insulation, of a semiconductor device produced using such a semiconductor sealant are extremely reliable.

Specific examples of the constituent (E) include the compounds shown below.

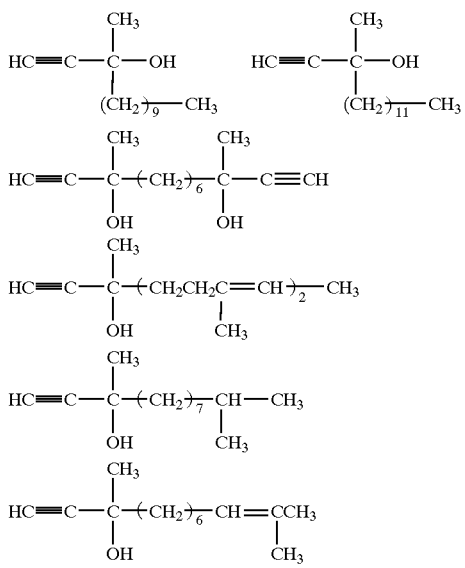

Of the above, the compound shown below is particularly preferred.

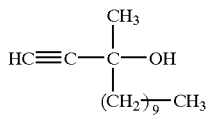

Compounds such as that shown above can be easily synthesized by reaction of a ketone with a metal acetylide (refer to "Experiments in Organic Chemistry" Vol. [3] Synthesis Reactions [1], p. 84, (1990), published by Kagaku-Dojin Publishing Co., Inc.).

The quantity of the constituent (E) should be sufficient to produce a molar ratio relative to the quantity (molar quantity) of the platinum group metal within the constituent (D) within a range from 1 to 1,000, and preferably from 1 to 500, and even more preferably from 2 to 100. If the quantity of the constituent (E) is less than equimolar relative to the quantity of the platinum group metal, then insufficient inhibiting and control action is produced, and long term storage becomes impossible. In contrast if the quantity of the constituent (E) exceeds a molar ratio of 1,000, then the inhibiting and controlling action becomes overly strong, making the curing overly slow, and increasing the likelihood of corrugations on the surface or internal foaming within the composition, when the sealant is subjected to curing under heat.

[Other Constituents]

In addition to the constituents (A) to (E) described above, a variety of other additives may also be incorporated within a composition of the present invention where necessary, provided such addition is restricted to a quantity which does not impair the effects of the present invention. Examples of such additives include fused silica, crystalline silica (quartz powder), silica produced by melting and oxidizing metallic silicon, silica produced by the sol-gel method, and crushed silica. The form of the silica is also not restricted, and roughly spherical forms, spherical forms, crushed forms and amorphous forms are all usable. However, in the case of a sealant for use with a memory semiconductor device, a synthetic silica with low uranium and thorium content is preferred. Furthermore, other additives including reinforcing inorganic fillers such as ultra fine powders of fumed silica or precipitated silica with an average particle diameter of no more than 0.05 $\mu$m, or fumed titanium dioxide, and non-reinforcing inorganic fillers such as calcium silicate, titanium dioxide, iron (II) oxide and carbon black, may also be added. In addition, resins such as curable epoxy resins, curable epoxy modified silicone resins, curable silicone modified epoxy resins, curable polyimide resins, curable polyimide modified silicone resins and curable silicone modified polyimide resins and the like may also be added, provided such addition does not impair the effects of the present invention.

EXAMPLES

As follows is a description of a series of examples and comparative examples of the present invention. In the examples below, the unit parts refers to parts by weight, and viscosity values refer to measurements conducted at 25° C.

Example 1

A mixture of (A) 100 parts by weight of a dimethylpolysiloxane with both terminals of the molecular chain blocked with dimethylvinylsiloxy groups (with a vinyl group content within the dimethylpolysiloxane of 0.0053 mol/100 g) and with a viscosity of 5,000 mPa·s, (B) 3.6 parts by weight of a methylhydrogenpolysiloxane with both terminals of the molecular chain blocked with trimethylsiloxy groups (with a quantity of hydrogen atoms bonded to silicon atoms (SiH groups) within the methylhydrogenpolysiloxane of 0.3 mol/100 g) (producing a molar ratio H/Vi (hereafter this abbreviation is used) of the number of SiH groups within the constituent (B) relative to the number of vinyl groups within the constituent (A) of 2.0 mol/mol), (C) 0.3 parts by weight of an isocyanurate modified silicone additive represented by a formula shown below,

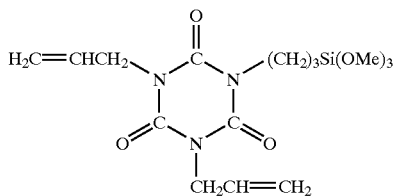

(D) 0.1 parts by weight of a 2-ethylhexylalcohol solution of chloroplatinic acid (2% by weight) (producing an equivalent of 20 ppm of platinum metal relative to the constituent (A)), (E) 0.3 parts by weight of a compound represented by a formula shown below (a molar ratio of 298 relative to the quantity of platinum metal of the constituent (D)),

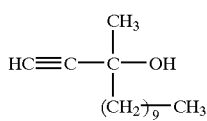

and 160 parts by weight of fused silica (average particle diameter of 3 μm) was mixed well, and yielded an addition curing type silicone sealant Using this sealant, a resin sealed semiconductor device shown in FIG. 1 was prepared. In other words, a semiconductor chip 1 was fixed to a semiconductor chip mounting member 2 which was fixed on solder balls 5, and a device with connected wiring 4 was prepared. Subsequently, a metal mask screen printer (manufactured by Newlong Industrial Co., Ltd.) was used to screen print a sealant 3 so as to cover the semiconductor chip 1 and the wiring 4. Printing tests were performed immediately after preparation of the sealant, and also 3 hours after preparation, 6 hours after preparation and 12 hours after preparation, and following each printing test, the sealant was cured at 150° C. for 1 hour.

In order to evaluate the reliability of the semiconductor device in terms of resistance to moisture permeation and electrical insulation, a pressure cooker test (measurement conditions: 121° C. and 2 atmospheres) was performed. Furthermore, following completion of this test, the semiconductor device was unsealed, and the interfaces between the cured sealant and the semiconductor chip, and between the sealant and the chip mounting member were inspected visually.

The results are shown in Table 1 and Table 2.

Example 2

With the exceptions of using 1.0 parts by weight of an epoxy group containing hydrogensiloxane represented by a formula shown below as the constituent (C),

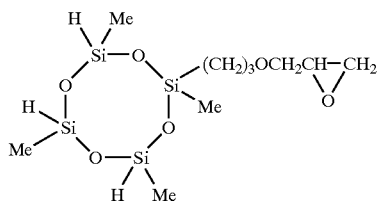

and 0.4 parts by weight (a molar ratio of 347 relative to the quantity of platinum metal of the constituent (D) described in the example 1) of a compound represented by a formula shown below as the constituent (E),

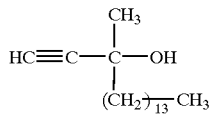

an addition curing type silicone sealant was prepared and then evaluated in a similar manner to the example 1.

Example 3

With the exceptions of reducing the quantity of the constituent (B) to 1.0 parts by weight (H/Vi=0.6 mol/mol), using 3.0 parts by weight of a partial hydrolysate of trimethoxysilane, represented by an average formula shown below, as the constituent (C),

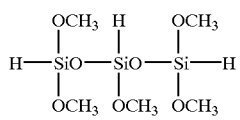

and increasing the quantity of the constituent (E) to 0.4 parts by weight (a molar ratio of 397 relative to the quantity of platinum metal of the constituent (D) described in the example 1), an addition curing type silicone sealant was prepared and then evaluated in a similar manner to the example 1.

Example 4

With the exceptions of reducing the quantity of the constituent (B) to 1.2 parts by weight (H/Vi=0.7 mol/mol), using 6.0 parts by weight of a partial hydrolysate of tetramethoxysilane, represented by an average formula shown below, as the constituent (C),

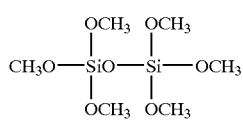

and increasing the quantity of the constituent (E) to 0.4 parts by weight (a molar ratio of 397 relative to the quantity of platinum metal of the constituent (D) described in the example 1), an addition curing type silicone sealant was prepared and then evaluated in a similar manner to the example 1.

Comparative Example 1

With the exceptions of using 3.0 parts by weight of vinyltrimethoxysilane as the constituent (C), and 0.2 parts by weight (a molar ratio of 440 relative to the quantity of platinum metal of the constituent (D) described in the example 1) of a compound represented by a formula shown below as the constituent (E),

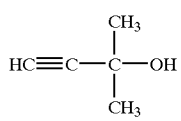

an addition curing type silicone sealant was prepared and then evaluated in a similar manner to the example 1.

Comparative Example 2

With the exceptions of reducing the quantity of the constituent (B) to 1.2 parts by weight (H/Vi=0.7 mol/mol), using no constituent (C), and increasing the quantity of the constituent (E) to 0.4 parts by weight, an addition curing type silicone sealant was prepared and then evaluated in a similar manner to the example 1.

TABLE 1

Screen Printability (Maintenance of target shape)

|  | Example 1 | Example 2 | Example 3 | Example 4 | Comparative example 1 | Comparative example 2 |
|---|---|---|---|---|---|---|
| immediately after preparation | good | good | good | good | good | good |
| 3 hours after preparation | good | good | good | good | poor (high viscosity) | unstable |
| 6 hours after preparation | good | good | good | good | poor | poor (high viscosity) |
| 12 hours after preparation | good | good | good | good | poor | poor |

Notes)
good: The target shape was obtained.
poor: The target shape was unattainable due to problems such as the incorporation of air bubbles resulting from increased viscosity.
unstable: The target shape was unattainable due to the sealant flowing outside the mask during curing.

TABLE 2

|  | Examples | | | | Comparative examples | |
|---|---|---|---|---|---|---|
|  | Example 1 | Example 2 | Example 3 | Example 4 | Comparative example 1 | Comparative example 2 |
| Percentage of poor results in pressure cooker test (121° C., 2 atmospheres) | | | | | | |
| 168 hours | 0% | 0% | 0% | 0% | 20% | 50% |
| 500 hours | 0% | 0% | 0% | 0% | 90% | 100% |
| 1000 hours | 0% | 0% | 0% | 0% | 100% | 100% |
| Visual inspection of unsealed product following completion of test | | | | | | |
| interface with chip | good adhesion | good adhesion | good adhesion | good adhesion | some foaming | peeling |
| interface with mounting member | good adhesion | good adhesion | good adhesion | good adhesion | some foaming | peeling |

Note)
good adhesion: cohesive failure of 100%.

A semiconductor sealing silicone composition of the present invention displays a satisfactory usable life (pot life) for the production of semiconductor devices, cures rapidly on heating, is suitable for screen printing applications, offers good productivity, displays excellent adhesion to semiconductor chips and mounting members, and also enables the production of a highly reliable semiconductor device with superior moisture permeation resistance and electrical insulation.

What is claimed is:

1. A silicone composition comprising:
   (A) 100 parts by weight of a diorganopolysiloxane with at least two alkenyl groups bonded to silicon atoms within each molecule;
   (B) an organohydrogenpolysiloxane with at least two hydrogen atoms bonded to silicon atoms within each molecule, in sufficient quantity to produce 0.5 to 10 mols of hydrogen atoms bonded to silicon atoms within said constituent (B) per 1 mol of alkenyl groups bonded to silicon atoms within said constituent (A);
   (C) 0.05 to 20 parts by weight of an adhesion imparting constituent, wherein the adhesion imparting constituent is:
   an organosilane-modified isocyanurate or an organosiloxane-modified isocyanurate;
   (D) 0.1 to 2,000 ppm of a platinum group metal based catalyst relative to the total weight of said constituents (A) and (B); and
   (E) a compound represented by a general formula (1) shown below,

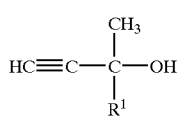

(1)

(wherein, $R^1$ represents a monovalent hydrocarbon group of at least 10 carbon atoms, which optionally contains an OH group or an ether linkage), in sufficient quantity to produce a molar ratio within a range from 1 to 1,000 of this compound relative to a quantity of said platinum group metal within said constituent (D).

2. A composition according to claim 1, wherein an alkenyl group containing diorganopolysiloxane of said constituent (A) is represented by a general formula (2) shown below:

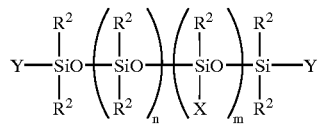
(2)

(wherein, each $R^2$ represents, independently, a substituted or unsubstituted monovalent hydrocarbon group with no aliphatic unsaturated bonds, X represents an alkenyl group, each Y represents, independently, an alkenyl group or a group $R^2$ as defined above, n represents an integer of 0 or greater and m represents an integer of 0 or greater, although a sum of m+n is within a range from 10 to 10,000, and when m=0, both Y groups are alkenyl groups, whereas when m=1, at least one of said Y groups is an alkenyl group).

3. A composition according to claim 2, wherein in said general formula (2), each $R^2$ group represents, independently, an alkyl group, a cycloalkyl group, an aryl group, an aralkyl group, or a group in which at least a portion of hydrogen atoms bonded to carbon atoms within said groups are substituted with a halogen atom or a cyano group, and said group comprises from 1 to 12 carbon atoms.

4. A composition according to claim 3, wherein each $R^2$ group represents, independently, a methyl group, an ethyl group, a phenyl group or a 3,3,3-trifluoropropyl group.

5. A composition according to claim 2, wherein X and Y each represent, independently, a lower alkenyl group of 2 to 4 carbon atoms.

6. A composition according to claim 1, wherein an organohydrogenpolysiloxane of said constituent (B) is represented by an average composition formula (3) shown below:

$$R^3{}_a H_b SiO_{(4-a-b)/2} \qquad (3)$$

(wherein, $R^3$ represents an unsubstituted or substituted monovalent hydrocarbon group with no aliphatic unsaturated bonds, a represents a positive number from 0.7 to 2.1, b represents a positive number from 0.001 to 1.0, and a+b represents a positive number from 0.8 to 3.0).

7. A composition according to claim 6, wherein in said general formula (3), each $R^3$ represents, independently, a methyl group or a phenyl group.

8. A composition according to claim 1, wherein in said general formula (1) representing a compound of said constituent (E), $R^1$ represents:

a group represented by a formula

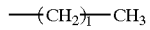

(wherein, l represents an integer of 9 or greater), a group represented by a formula

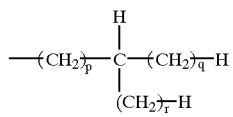

(wherein, p, q and r each represent an integer of 0 or greater, and a sum of p+q+r represents an integer of 9 or greater), a group represented by a formula

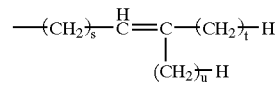

(wherein, s, t and u each represent an integer of 0 or greater, and a sum of s+t+u represents an integer of 8 or greater), a group represented by a formula

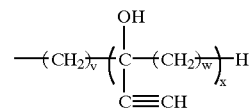

(wherein, v and w each represent an integer of 0 or greater, x represents an integer of 1 or greater, and a total number of carbon atoms of a group represented by said formula is at least 10), or a group represented by a formula

(wherein, y and z each represent an integer of 0 or greater, and a sum of y+z represents an integer of 9 or greater).

9. A composition according to claim 1, wherein a quantity of said constituent (B) produces from 1 to 7 mols of hydrogen atoms bonded to silicon atoms within said constituent (B) per 1 mol of alkenyl groups bonded to silicon atoms within said constituent (A), a quantity of said constituent (C) is within a range from 0.1 to 10 parts by weight per 100 parts by weight of said constituent (A), a quantity of said constituent (D) is equivalent to 0.1 to 1,000 ppm of platinum group metal relative to a combined weight of said constituent (A) and said constituent (B), and a quantity of said constituent (E) is within a range from 1 to 500 mols per 1 mol of platinum group metal within said constituent (D).

10. A method of screening printing, comprising printing the silicone composition according to claim 1 onto a substrate.

11. A semiconductor device, comprising a substrate having thereon a cured product of a silicone composition comprising: A) 100 parts by weight of a diorganopolysiloxane with at least two alkenyl groups bonded to silicon atoms within each molecule;

(B) an organohydrogenpolysiloxane with at least two hydrogen atoms bonded to silicon atoms within each molecule, in sufficient quantity to produce 0.5 to 10 mols of hydrogen atoms bonded to silicon atoms within said constituent (B) per 1 mol of alkenyl groups bonded to silicon atoms within said constituent (A);

(C) 0.05 to 20 parts by weight of an adhesion imparting constituent, wherein the adhesion imparting constituent is:

(i) an alkoxysilane represented by a general formula $R^4{}_c Si(OR^5)_{4-c}$,
wherein, $R^4$ represents a hydrogen atom and/or a γ-glycidoxypropyl group, $R^5$ represents an alkyl group or an alkoxy substituted alkyl group, and c represents either 0 or 1; or a partial hydrolysis condensate thereof; or mixtures of two or more of the said alkoxysilanes or the partial hydrolysis condensates thereof;

(ii) an organosilane or an organosiloxane modified isocyanurate; and/or (iii) an epoxy group containing hydrogenpolysiloxane;

(D) 0.1 to 2.000 ppm of a platinum group metal, based catalyst, relative to the total weight of said constituents (A) and (B); and (E) a compound represented by a general formula (1) shown below,

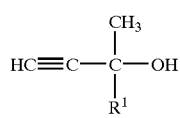
(1)

(wherein, $R^1$ represents a monovalent hydrocarbon group of at least 10 carbon atoms, which optionally contains an OH group or an ether linkage), in sufficient quantity to produce a molar ratio within a range from 1 to 1,000 of this compound relative, to a quantity of said platinum group metal within said constituent (D).

12. The semiconductor device of claim 11, wherein the substrate is a semiconductor chip.

13. The semiconductor device according to claim 11, wherein an alkenyl group containing diorganopolysiloxane of said constituent (A) is represented by a general formula (2) shown below:

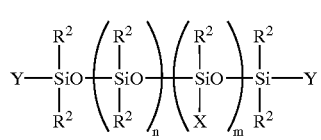
(2)

(wherein, each $R^2$ represents, independently, a substituted or unsubstituted monovalent hydrocarbon group with no aliphatic unsaturated bonds, X represents an alkenyl group, each Y represents, independently, an alkenyl group or a group $R^2$ as defined above, n represents an integer of 0 or greater and m represents an integer of 0 or greater, although a sum of m+n is within a range from 10 to 10,000, and when m=0, both Y groups are alkenyl groups, whereas when m=1, at least one of said Y groups is an alkenyl group).

14. The semiconductor device according to claim 13, wherein in said general formula (2), each $R^2$ group represents, independently, an alkyl group, a cycloalkyl group, an aryl group, an aralkyl group, or a group in which at least a portion of hydrogen atoms bonded to carbon atoms within said groups are substituted with a halogen atom or a cyano group, and said group comprises from 1 to 12 carbon atoms.

15. The semiconductor device according to claim 14, wherein each $R^2$ group represents, independently, a methyl group, an ethyl group, a phenyl group or a 3,3,3-trifluoropropyl group.

16. The semiconductor device according to claim 14, wherein X and Y each represent, independently, a lower alkenyl group of 2 to 4 carbon atoms.

17. The semiconductor device according to claim 11, wherein an organohydrogenpolysiloxane of said constituent (B) is represented by an average composition formula (3) shown below:

(3)

(wherein, $R^3$ represents an unsubstituted or substituted monovalent hydrocarbon group with no aliphatic unsaturated bonds, a represents a positive number from 0.7 to 2.1, b represents a positive number from 0.001 to 1.0, and a+b represents a positive number from 0.8 to 3.0).

18. The semiconductor device according to claim 17, wherein in said general formula (3), each $R^3$ represents, independently, a methyl group or a phenyl group.

19. The semiconductor device according to claim 11, wherein in said general formula (1) representing a compound of said constituent (E), $R^1$ represents:

a group represented by a formula

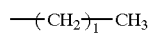

(wherein, l represents an integer of 9 or greater), a group represented by a formula

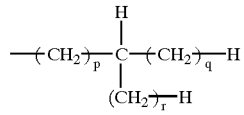

(wherein, p, q and r each represent an integer of 0 or greater, and a sum of p+q+r represents an integer of 9 or greater), a group represented by a formula

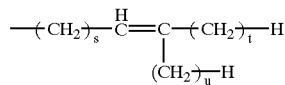

(wherein, s, t and u each represent an integer of 0 or greater, and a sum of s+t+u represents an integer of 8 or greater), a group represented by a formula

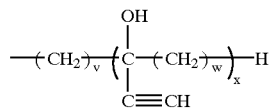

(wherein, v and w each represent an integer of 0 or greater, x represents an integer of 1 or greater, and a total number of carbon atoms of a group represented by said formula is at least 10), or a group represented by a formula

(wherein, y and z each represent an integer of 0 or greater, and a sum of y+z represents an integer of 9 or greater).

20. The semiconductor device according to claim 11, wherein a quantity of said constituent (B) produces from 1 to 7 mols of hydrogen atoms bonded to silicon atoms within said constituent (B) per 1 mol of alkenyl groups bonded to silicon atoms within said constituent (A), a quantity of said constituent (C) is within a range from 0.1 to 10 parts by weight per 100 parts by weight of said constituent (A), a quantity of said constituent (D) is equivalent to 0.1 to 1,000 ppm of platinum group metal relative to a combined weight of said constituent (A) and said constituent (B), and a quantity of said constituent (E) is within a range from 1 to 500 mols per 1 mol of platinum group metal within said constituent (D).

21. A method of screening printing, comprising printing a silicone composition comprising: A) 100 parts by weight of a diorganopolysiloxane with at least two alkenyl groups bonded to silicon atoms within each molecule;
- (B) an organohydrogenpolysiloxane with at least two hydrogen atoms bonded to silicon atoms within each molecule, in sufficient quantity to produce 0.5 to 10 mols of hydrogen atoms bonded to silicon atoms within said constituent (B) per 1 mol of alkenyl groups bonded to silicon atoms within said constituent (A);
- (C) 0.05 to 20 parts by weight of an adhesion imparting constituent, wherein the adhesion imparting constituent is:
- (i) an alkoxysilane represented by a general formula $R^4_c Si(OR^5)_{4-c}$,
  wherein, $R^4$ represents a hydrogen atom and/or a γ-glycidoxypropyl group, $R^5$ represents an alkyl group or an alkoxy substituted alkyl group, and c represents either 0 or 1; or a partial hydrolysis condensate thereof; or mixtures of two or more of the said alkoxysilanes or the partial hydrolysis condensates thereof;
- (ii) an organosilane or an organosiloxane modified isocyanurate; and/or
- (iii) an epoxy group containing hydrogenpolysiloxane;
- (D) 0.1 to 2.000 ppm of a platinum group metal, based catalyst, relative to the total weight of said constituents (A) and (B); and
- (E) a compound represented by a general formula (1) shown below,

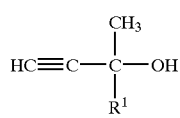
(1)

(wherein, $R^1$ represents a monovalent hydra carbon group of at least 10 carbon atoms, which optionally contains an OH group or an ether linkage), in sufficient quantity to produce a molar ratio within a range from 1 to 1,000 of this compound relative, to a quantity of said platinum group metal within said constituent (D) onto a semiconductor chip.

22. The method according to claim 21, wherein an alkenyl group containing diorganopolysiloxane of said constituent (A) is represented by a general formula (2) shown below:

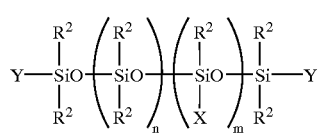
(2)

(wherein, each $R^2$ represents, independently, a substituted or unsubstituted monovalent hydrocarbon group with no aliphatic unsaturated bonds, X represents an alkenyl group, each Y represents, independently, an alkenyl group or a group $R^2$ as defined above, n represents an integer of 0 or greater and in represents an integer of 0 or greater, although a sum of m+n is within a range from 10 to 10,000, and when m=0, both Y groups are alkenyl groups, whereas when m=1, at least one of said Y groups is an alkenyl group).

23. The method according to claim 22, wherein X and Y each represent, independently, a lower alkenyl group of 2 to 4 carbon atoms.

24. The method according to claim 22, wherein in said general formula (2), each $R^2$ group represents, independently, an alkyl group, a cycloalkyl group, an aryl group, an aralkyl group, or a group in which at least a portion of hydrogen atoms bonded to carbon atoms within said groups are substituted with a halogen atom or a cyano group, and said group comprises from 1 to 12 carbon atoms.

25. The method according to claim 24, wherein each $R^2$ group represents, independently, a methyl group, an ethyl group, a phenyl group or a 3,3,3-trifluoropropyl group.

26. The method according to claim 21, wherein an organohydrogenpolysiloxane of said constituent (B) is represented by an average composition formula (3) shown below:

(3)

(wherein, $R^3$ represents an unsubstituted or substituted monovalent hydrocarbon group with no aliphatic unsaturated bonds, a represents a positive number from 0.7 to 2.1, b represents a positive number from 0.001 to 1.0, and a+b represents a positive number from 0.8 to 3.0).

27. The method according to claim 26, wherein in said general formula (3), each $R^3$ represents, independently, a methyl group or a phenyl group.

28. The method according to claim 21, wherein in said general formula (1) representing a compound of said constituent (E), $R^1$ represents:

a group represented by a formula

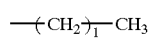

(wherein, l represents an integer of 9 or greater), a group represented by a formula

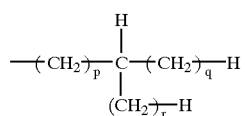

(wherein, p, q and r each represent an integer of 0 or greater, and a sum of p+q+r represents an integer of 9 or greater), a group represented by a formula

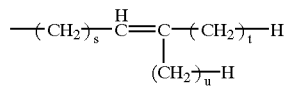

(wherein, s, t and u each represent an integer of 0 or greater, and a sum of s+t+u represents an integer of 8 or greater), a group represented by a formula

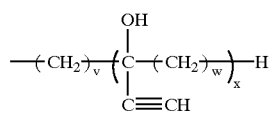

(wherein, v and w each represent an integer of 0 or greater, x represents an integer of 1 or greater, and a total number of carbon atoms of a group represented by said formula is at least 10), or a group represented by a formula

(wherein, y and z each represent an integer of 0 or greater, and a sum of y+z represents an integer of 9 or greater).

29. The method according to claim 21, wherein a quantity of said constituent (B) produces from 1 to 7 mols of hydrogen atoms bonded to silicon atoms within said constituent (B) per 1 mol of alkenyl groups bonded to silicon atoms within said constituent (A), a quantity of said constituent (C) is within a range from 0.1 to 10 parts by weight per 100 parts by weight of said constituent (A), a quantity of said constituent (D) is equivalent to 0.1 to 1,000 ppm of platinum group metal relative to a combined weight of said constituent (A) and said constituent (B), and a quantity of said constituent (E) is within a range from 1 to 500 mols per 1 mol of platinum group metal within said constituent (D).

* * * * *